United States Patent
Ahn et al.

(10) Patent No.: US 9,704,929 B2
(45) Date of Patent: Jul. 11, 2017

(54) DISPLAY PANEL AND METHOD OF MANUFACTURING THE SAME

(71) Applicant: Samsung Display Co., LTD., Yongin, Gyeonggi-Do (KR)

(72) Inventors: Soon-Sung Ahn, Cheonan-si (KR); Hyung-Soo Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/956,978

(22) Filed: Dec. 2, 2015

(65) Prior Publication Data

US 2016/0087014 A1    Mar. 24, 2016

Related U.S. Application Data

(62) Division of application No. 14/336,324, filed on Jul. 21, 2014, now Pat. No. 9,231,033.

(30) Foreign Application Priority Data

Jul. 22, 2013    (KR) .................. 10-2013-0085919

(51) Int. Cl.
*H01L 27/32* (2006.01)
*H01L 51/56* (2006.01)
*H01L 51/00* (2006.01)

(52) U.S. Cl.
CPC ...... *H01L 27/3218* (2013.01); *H01L 51/0011* (2013.01); *H01L 51/56* (2013.01)

(58) Field of Classification Search
CPC .................................................. H01L 27/3218
See application file for complete search history.

(56) References Cited

U.S. PATENT DOCUMENTS

| | | |
|---|---|---|
| 6,219,051 B1 | 4/2001 | Furuya |
| 6,892,014 B2 | 5/2005 | Cok et al. |
| 7,176,940 B2 | 2/2007 | Choe et al. |
| 7,864,202 B2 | 1/2011 | Brown Elliott et al. |
| 8,933,959 B2 | 1/2015 | Brown Elliott et al. |
| 2003/0085906 A1 | 5/2003 | Elliott et al. |
| 2004/0017985 A1 | 1/2004 | Cok et al. |
| 2007/0018911 A1 | 1/2007 | Yim et al. |
| 2009/0002262 A1 | 1/2009 | Fukushima et al. |
| 2009/0243984 A1 | 10/2009 | Fujinawa et al. |
| 2010/0033084 A1 | 2/2010 | Ko et al. |
| 2011/0012820 A1 | 1/2011 | Kim et al. |
| 2013/0056617 A1 | 3/2013 | Massetti |
| 2015/0015465 A1 | 1/2015 | Gong |
| 2015/0035731 A1 | 2/2015 | Wang et al. |

FOREIGN PATENT DOCUMENTS

| | | |
|---|---|---|
| KR | 100947771 B1 | 3/2010 |
| KR | 1020110006343 A | 1/2011 |
| KR | 1020120041510 A | 5/2012 |

*Primary Examiner* — Douglas Menz
(74) *Attorney, Agent, or Firm* — Cantor Colburn LLP (57) ABSTRACT

A display panel includes a plurality of unit pixels, where each of the unit pixels has a hexagonal-shape and includes: a first sub-pixel configured to emit a first color light, where the first sub-pixel has a rhombus-shape; a second sub-pixel configured to emit a second color light, where the second sub-pixel has the rhombus-shape; and a third sub-pixel configured to emit a third color light, where the third sub-pixel has the rhombus-shape, where first sub-pixels, second sub-pixels or third sub-pixels of neighboring unit pixels in a same row are arranged to adjoin each other.

6 Claims, 7 Drawing Sheets

DISPLAY PANEL AND METHOD OF MANUFACTURING THE SAME

This application is a divisional of U.S. patent application Ser. No. 14/336,324, filed on Jul. 21, 2014, which claims priority to Korean patent Application No. 10-2013-0085919, filed on Jul. 22, 2013, and all the benefits accruing therefrom under 35 U.S.C. §119, the content of which in its entirety is herein incorporated by reference.

BACKGROUND

1. Technical Field

Exemplary embodiments relate generally to a display panel. More particularly, exemplary embodiments of the invention relate to a display panel that includes a plurality of unit pixels, each having a first sub-pixel that emits a red color light (i.e., a red color sub-pixel), a second sub-pixel that emits a green color light (i.e., a green color sub-pixel), and a third sub-pixel that emits a blue color light (i.e., a blue color sub-pixel).

2. Description of the Related Art

Generally, a display panel may include a plurality of unit pixels. Each of the unit pixels may include a red color (R) sub-pixel, a green color (G) sub-pixel and a blue color (B) sub-pixel. In such a display panel, the red color sub-pixel, the green color sub-pixel and the blue color sub-pixel may be provided on a substrate using respective masks for forming the red color sub-pixel, the green color sub-pixel and the color blue color sub-pixel.

Recently, as a display panel is manufactured to have improved display ability (e.g., a high resolution), an area of respective organic layers of red color sub-pixels, an area of respective organic layers of green color sub-pixels and an area of respective organic layers of blue color sub-pixels are reduced. Accordingly, a distance between opening portions of the masks for forming a plurality of unit pixels of the display panel (e.g., red color sub-pixels, green color sub-pixels and blue color sub-pixels of the unit pixels) may be shortened. As a result, a mechanical strength of the mask may be reduced.

SUMMARY

Exemplary embodiments provide a display panel that implements a high resolution without reducing a mechanical strength of a mask for forming a plurality of unit pixels of the display panel (e.g., red color sub-pixels, green color sub-pixels and blue color sub-pixels of the unit pixels).

According to an exemplary embodiment, a display panel may include a plurality of unit pixels, where each of the unit pixels has a hexagonal-shape and includes: a first sub-pixel configured to emit a first color light, where the first sub-pixel has a rhombus-shape; a second sub-pixel configured to emit a second color light, where the second sub-pixel has the rhombus-shape; and a third sub-pixel configured to emit a third color light, where the third sub-pixel has the rhombus-shape, where first sub-pixels, second sub-pixels or third sub-pixels of neighboring unit pixels in a same row are arranged to adjoin each other.

In an exemplary embodiment, the unit pixels in an N-th row mesh with the unit pixels in an (N+1)-th row in a sawtooth shape, where N is an integer greater than or equal to 1.

In an exemplary embodiment, the first color light, the second color light and the third color light may be a red color light, a green color light, and a blue color light, respectively.

In an exemplary embodiment, an area of the first sub-pixel, an area of the second sub-pixel and an area of the third sub-pixel may be substantially equal to each other.

In an exemplary embodiment the first sub-pixels, the second sub-pixels or the third sub-pixels of neighboring unit pixels in a same column may be arranged to adjoin each other.

In an exemplary embodiment, the display panel may be an organic light emitting display panel.

In exemplary embodiment, the display panel may be a liquid crystal display panel.

According to an exemplary embodiment, a display panel may include a plurality of unit pixels, where each of the unit pixels has a triangle-shape and includes: a first sub-pixel configured to emit a first color light, where the first sub-pixel has an isosceles triangle-shape; a second sub-pixel configured to emit a second color light, where the second sub-pixel has the isosceles triangle-shape; and a third sub-pixel configured to emit a third color light, where the third sub-pixel has the isosceles triangle-shape, where first sub-pixels, second sub-pixels or third sub-pixels of neighboring unit pixels in a same row are arranged to adjoin each other.

In an exemplary embodiment, the first color light, the second color light, and the third color light may be a red color light, a green color light, and a blue color light, respectively.

In an exemplary embodiment, an area of the first sub-pixel, an area of the second sub-pixel and an area of the third sub-pixel may be substantially equal to each other.

In an exemplary embodiment, the display panel may be an organic light emitting display panel.

In an exemplary embodiment, the display panel may be a liquid crystal display panel.

According to another exemplary embodiment, a method of manufacturing a display panel includes: simultaneously providing a plurality of first sub-pixels of the display panel, where each of the first sub-pixels emits a first light; simultaneously providing a plurality of second sub-pixels of the display panel, where each of the second sub-pixels emits a second light; and simultaneously providing a plurality of second sub-pixels of the display panel, where each of the third sub-pixels emits a third light, where the display panel includes a plurality of unit pixels, each of the unit pixel includes a first sub-pixel, a second sub-pixel and a third sub-pixel, and the first sub-pixels, the second sub-pixels or the third sub-pixels of neighboring unit pixels in a same row are arranged to adjoin each other.

In an exemplary embodiment, each of the simultaneously providing the first sub-pixels, the simultaneously providing the second sub-pixels and the simultaneously providing the third sub-pixels may further include using a fine metal mask or a shadow mask.

In an exemplary embodiment, each of the unit pixels may have a hexagonal-shape, and each of the first sub-pixel, the second sub-pixel and the third sub-pixel may have a rhombus-shape.

In an exemplary embodiment, each of the unit pixels may have a triangle-shape, and each of the first sub-pixel, the second sub-pixel and the third sub-pixel may have an isosceles triangle shape.

In exemplary embodiments of the invention, a display panel may include a plurality of unit pixels, each having a red color sub-pixel, a green color sub-pixel and a blue color sub-pixel, where the red color sub-pixel, the green color sub-pixel, and the blue color sub-pixel may be provided using a mask for forming the red color sub-pixel, a mask for forming the green color sub-pixel, and a mask for forming the blue color sub-pixel, respectively. In such embodiments, the display panel may allow the mask to secure a sufficient distance between opening portions of the mask by arranging the red color sub-pixels of neighboring unit pixels located in the same row to adjoin each other, by arranging the green color sub-pixels of neighboring unit pixels located in the same row to adjoin each other, or by arranging the blue color sub-pixels of neighboring unit pixels located in the same row to adjoin each other. As a result, the display panel may implement a high resolution without reducing a mechanical strength of the mask for forming the unit pixels of the display panel (e.g., red color sub-pixels, green color sub-pixels, and blue color sub-pixels of the unit pixels).

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

The invention will be described more fully hereinafter with reference to the accompanying drawings, in which exemplary embodiments are shown. The invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. Like numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Figure 1:
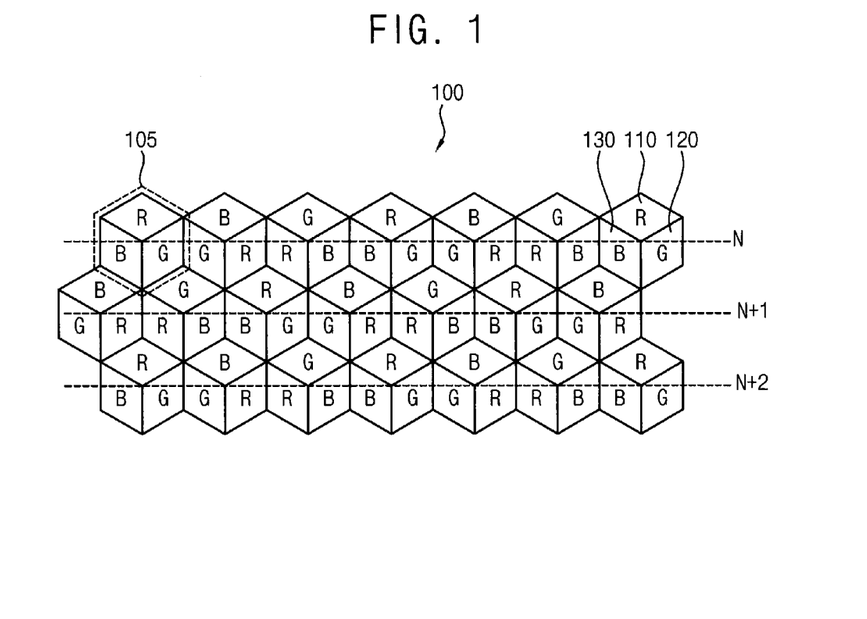
FIG. 1 is a plan view illustrating an exemplary embodiment of a display panel.

FIG. 1 is a plan view illustrating an exemplary embodiment of a display panel.

Referring to FIG. 1, the display panel 100 may include a plurality of unit pixels 105, each having a hexagonal-shape.

Each of the unit pixels 105 may include a first sub-pixel 110 that emits a first color light, a second sub-pixel 120 that emits a second color light, and a third sub-pixel 130 that emits a third color light. The first to third sub-pixels 110, 120 and 130 may have a rhombus-shape. In an exemplary embodiment, the first sub-pixels 110 of neighboring unit pixels 105 in a same row, the second sub-pixels 120 of neighboring unit pixels 105 in a same row, or the third sub-pixels 130 of neighboring unit pixels 105 in a same row may be arranged to adjoin each other on the display panel 100. In one exemplary embodiment, for example, each of the first sub-pixel 110, the second sub-pixel 120 and the third sub-pixel 130 may emit one of red color light, green color light, and blue color light.

In an exemplary embodiment, where a first unit pixel, a second unit pixel, a third unit pixel and a fourth unit pixel are disposed in a same row (e.g., an N-th row), a first sub-pixel 110 (e.g., a green color sub-pixel) of the first unit pixel and a first sub-pixel 110 (e.g., a green color sub-pixel) of the second unit pixel may be disposed adjacent to each other, a second sub-pixel 120 (e.g., a red color sub-pixel) of the second unit pixel and a second sub-pixel 120 (e.g., a red color sub-pixel) of the third unit pixel may be disposed adjacent to each other, and a third sub-pixel 130 (e.g., a blue color sub-pixel) of the third unit pixel and a third sub-pixel 130 (e.g., a blue color sub-pixel) of the fourth unit pixel may be disposed adjacent to each other. In such an embodiment, an area of the first sub-pixel 110, an area of the second sub-pixel 120, and an area of the third sub-pixel 130 may be substantially equal to each other.

In such an embodiment, where each of the unit pixels 105 has a hexagonal-shape, the first sub-pixels 110 of neighboring unit pixels 105 located in a same column, the second sub-pixels 120 of neighboring unit pixels 105 located in a same column, or the third sub-pixels 130 of neighboring unit pixels 105 located in a same column may be arranged to adjoin each other on the display panel 100.

In an exemplary embodiment, as illustrated in FIG. 1, the unit pixels 105 in the N-th row of the display panel 100 may mesh with the unit pixels 105 in an (N+1)-th row of the display panel 100 in a sawtooth shape, where N is an integer greater than or equal to 1. In such an embodiment, the first sub-pixels 110 (e.g., green color sub-pixels.) of the unit pixels 105 may be simultaneously provided, e.g., formed at the same time, using a mask for forming the first sub-pixels 110, the second sub-pixels 120 (e.g., red color sub-pixels.) of the unit pixels 105 may be simultaneously provided, e.g., formed at the same time, using a mask for forming the second sub-pixels 120, and the third sub-pixels 130 (e.g., blue color sub-pixels.) of the unit pixels 105 may be simultaneously provided, e.g., formed at the same time, using a mask for forming the third sub-pixels 130. In one exemplary embodiment, for example, the mask may be a fine metal mask. In another exemplary embodiment, the mask may be a shadow mask.

In an exemplary embodiment, where a first unit pixel, a second unit pixel, a third unit pixel and a fourth unit pixel are disposed in a same row (e.g., an N-th row), a first sub-pixel 110 (e.g., a green color sub-pixel) of the first unit pixel and a first sub-pixel 110 (e.g., a green color sub-pixel) of the second unit pixel may be formed at the same time using a same opening portion of the mask (e.g., the fine metal mask), a second sub-pixel 120 (e.g., a red color sub-pixel) of the second unit pixel and a second sub-pixel 120 (e.g., a red color sub-pixel) of the third unit pixel may be formed at the same time using a same opening portion of the mask, and a third sub-pixel 130 (e.g., a blue color sub-pixel) of the third unit pixel and a third sub-pixel 130 (e.g., a blue color sub-pixel) of the fourth unit pixel may be formed at the same time using a same opening portion of the mask.

In a conventional display panel that includes a plurality of unit pixels, first sub-pixels of neighboring unit pixels located in the same row and/or the same column, second sub-pixels of neighboring unit pixels located in the same row and/or the same column, or third sub-pixels of neighboring unit pixels located in the same row and/or the same column are spaced apart from each other. Accordingly, such a structure of the conventional display panel may not allow the mask to secure a sufficient distance between opening portions of the mask. As a result, the conventional display panel has limits to implement a high resolution because a mechanical strength of respective masks for forming the first sub-pixels, the second sub-pixels, and the third sub-pixels of the unit pixels is reduced (e.g., weakened).

In an exemplary embodiment of the invention, a display panel 100 may include a plurality of unit pixels 105, each having a red color sub-pixel, a green color sub-pixel and a blue color sub-pixel, where the red color sub-pixel, the green color sub-pixel and the blue color sub-pixel may be provided using a mask for forming the red sub-pixel, a mask for forming the green sub-pixel and a mask for forming the blue sub-pixel, respectively. In such an embodiment, such a structure of the display panel 100 may allow the mask to secure a sufficient distance between opening portions of the mask by arranging the red color sub-pixels of neighboring unit pixels 105 in the same row to adjoin each other, by arranging the green color sub-pixels of neighboring unit pixels 105 in the same row to adjoin each other, or by arranging the blue color sub-pixels of neighboring unit pixels 105 in the same row to adjoin each other. As a result, the display panel 100 may implement a high resolution without reducing a mechanical strength of a mask for forming the unit pixels 105 of the display panel 100 (e.g., the red color sub-pixels, the green color sub-pixels and the blue color sub-pixels of the unit pixels 105).

Figure 2A:
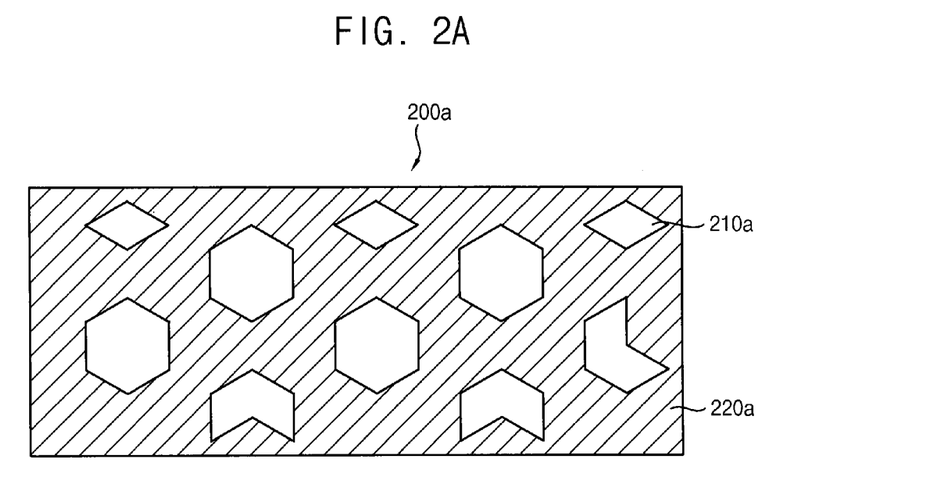
FIGS. 2A to 2C are plan views illustrating an exemplary embodiment of masks for forming a plurality of unit pixels of the display panel of FIG. 1.
Figure 2B:
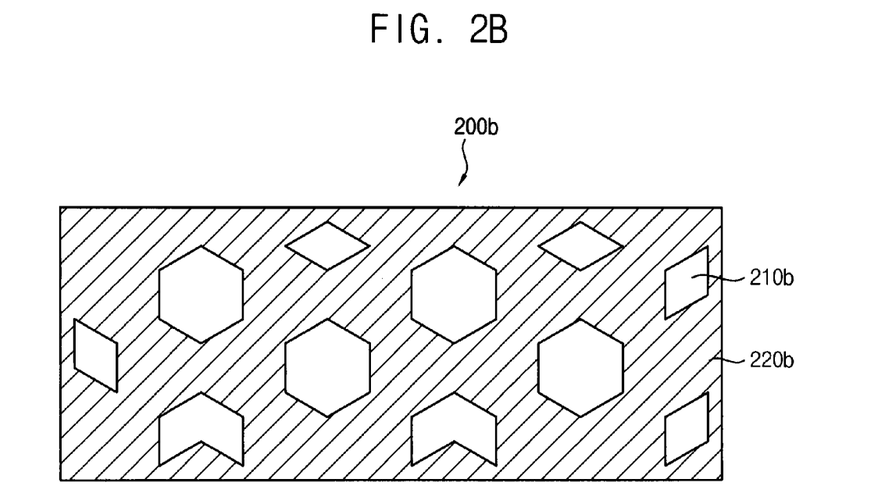
Figure 2C:
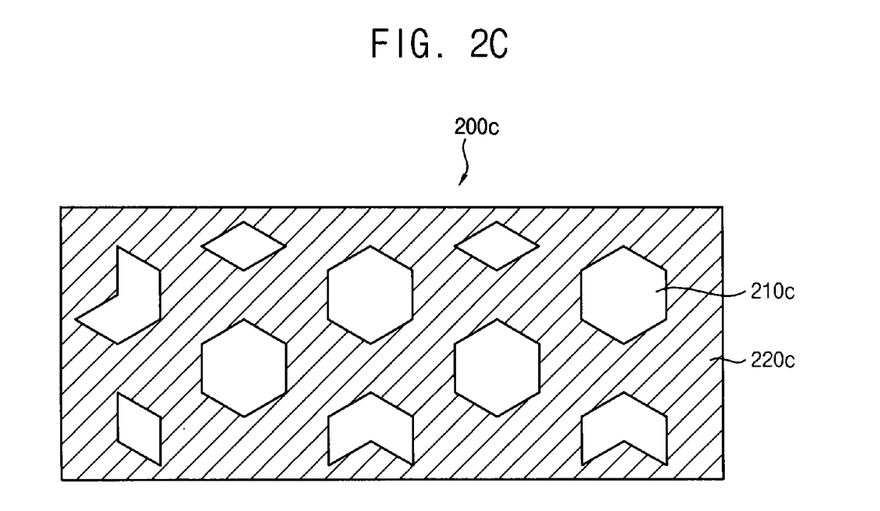

FIGS. 2A to 2C are plan views illustrating exemplary embodiments of masks for forming a plurality of unit pixels of the display panel of FIG. 1.

Referring to FIG. 2A, a first mask 200a for forming first sub-pixels (e.g., red color sub-pixels) of the unit pixels 105 may include a plurality of first opening portions 210a and a first blocking portion 220a. In exemplary embodiments, the first mask 200a for forming the first sub-pixels may be a fine metal mask or a shadow mask. In an exemplary embodiment, the first sub-pixels of neighboring unit pixels in the same row may be arranged adjacent to each other on the display panel. In such an embodiment, the display panel may allow the first mask 200a to secure a sufficient distance between the first opening portions 210a by arranging the first sub-pixels of neighboring unit pixels in the same row to adjoin each other. As a result, the display panel may implement a high resolution without reducing a mechanical strength of the first mask 200a for forming the first sub-pixels.

Referring to FIG. 2B, a second mask 200b for forming second sub-pixels (e.g., green color sub-pixels) may include a plurality of second opening portions 210b and a second blocking portion 220b. In exemplary embodiments, the second mask 200b for forming the second sub-pixels may be a fine metal mask or a shadow mask. In such an embodiment, the second sub-pixels of neighboring unit pixels located in the same row may be arranged adjacent to each other on the display panel. In such an embodiment, the display panel may allow the second mask 200b to secure a sufficient distance between the second opening portions 210b of the second mask 200b by arranging the second sub-pixels of neighboring unit pixels located in the same row to adjoin each other. As a result, the display panel may implement a high resolution without reducing a mechanical strength of the second mask 200b for forming the second sub-pixels.

Referring to FIG. 2C, a third mask 200c for forming third sub-pixels (e.g., blue color sub-pixels) may include a plurality of third opening portions 210c and a third blocking portion 220c. In exemplary embodiments, the third mask 200c for forming the third sub-pixels may be a fine metal mask or a shadow mask. In such an embodiment, the third sub-pixels of neighboring unit pixels located in the same row may be arranged adjacent to each other on the display panel. In such an embodiment, the display panel may allow the third mask 200c to secure a sufficient distance between the third opening portions 210c of the mask by arranging the third sub-pixels of neighboring unit pixels located in the same row to adjoin each other. As a result, the display panel may implement a high resolution without reducing a mechanical strength of the third mask 200c for forming the third sub-pixels.

The unit pixels of the display panel may be provided, e.g., formed, using a plurality of masks (e.g., the first mask 200a for forming the first sub-pixels, the second mask 200b for forming the second sub-pixels and the third mask 200c for forming the third sub-pixels). However, the invention is not limited thereto. In one alternative exemplary embodiment, for example, the unit pixels of the display panel may be formed using a single mask for forming the first sub-pixels, the second sub-pixels and the third sub-pixels by moving the single mask using a specific apparatus for moving the mask.

Figure 3A:
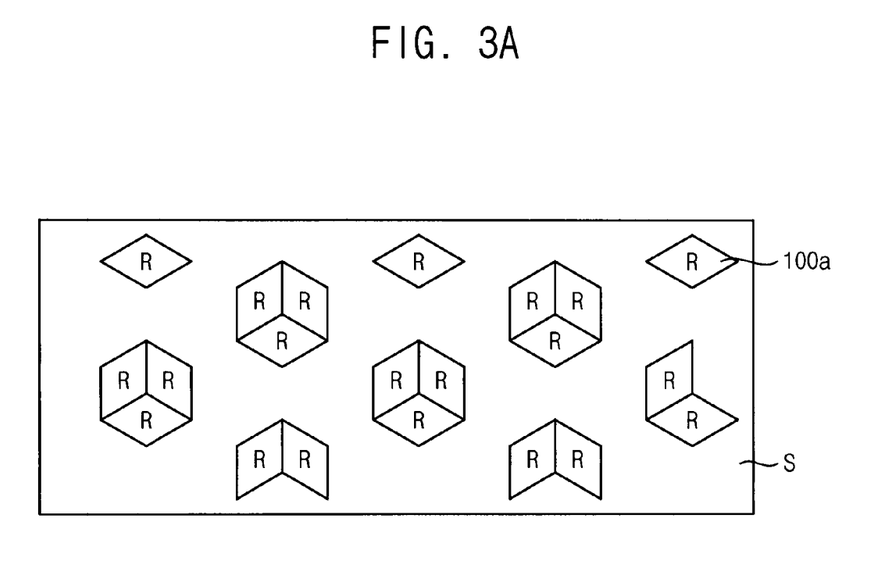
FIGS. 3A to 3C are plan views illustrating an exemplary embodiment of a method of manufacturing a plurality of unit pixels of the display panel of FIG. 1.
Figure 3B:
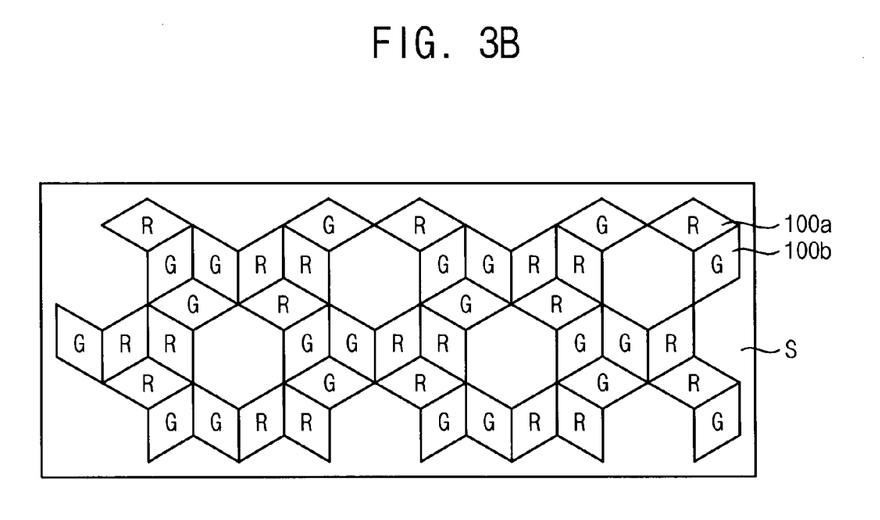
Figure 3C:
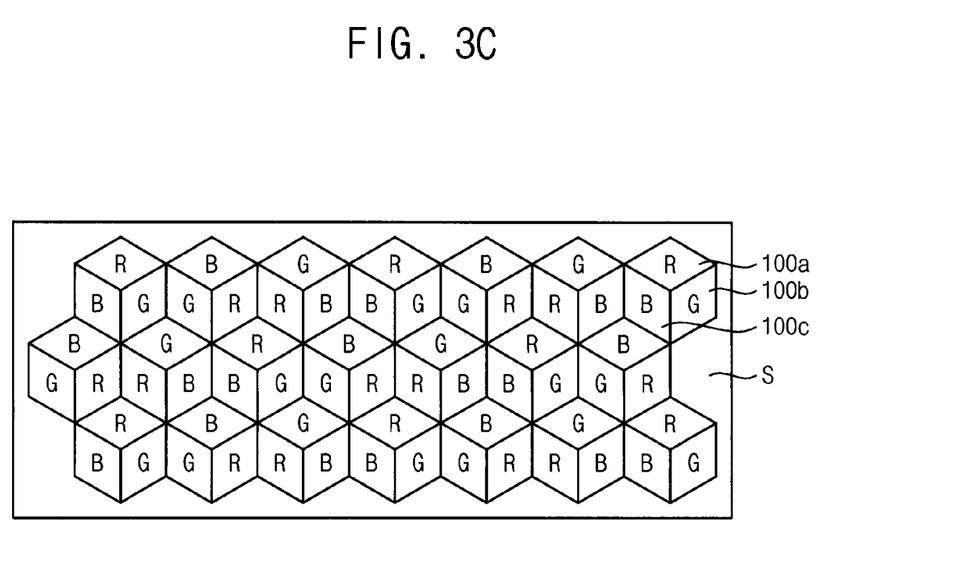

FIGS. 3A to 3C are plan views illustrating an exemplary embodiment of a method of manufacturing a plurality of unit pixels of the display panel of FIG. 1.

Referring to FIGS. 3A to 3C, a first mask (see FIG. 2A) for forming first sub-pixels 100a (e.g., red color sub-pixels) of the unit pixels, a second mask (see FIG. 2B) for forming second sub-pixels 100b (e.g., green color sub-pixels) of the unit pixels, a third mask (see FIG. 2C) for forming third sub-pixels 100c (e.g., blue color sub-pixels) of the unit pixels may be positioned on a substrate S, and then the first sub-pixels 100a, the second sub-pixels 100b and the third sub-pixels 100c may be sequentially formed on the substrate S using the first mask for forming the first sub-pixels 100a, the second mask for forming the second sub-pixels 100b, and the third mask for forming the third sub-pixels 100c, respectively.

As illustrated in FIG. 3A, the first sub-pixels 100a may be simultaneously formed on the substrate S using the first mask for forming the first sub-pixels 100a. In exemplary embodiments, the first sub-pixels 100a may emit a first color light. In an exemplary embodiment, for example, the first color light may correspond to a red color light.

As illustrated in FIG. 3B, the second sub-pixels 100b may be simultaneously formed on the substrate S using the second mask for forming the second sub-pixels 100b. In exemplary embodiments, the second sub-pixels 100b may emit a second color light. In an exemplary embodiment, for example, the second color light may correspond to a green color light.

As illustrated in FIG. 3C, the third sub-pixel 100c may be simultaneously formed on the substrate S using the third mask for forming the third sub-pixels 100c. In exemplary embodiments, the third sub-pixels 100c may emit a third color light. In an exemplary embodiment, for example, the third color light may correspond to a blue color light.

Figure 4:
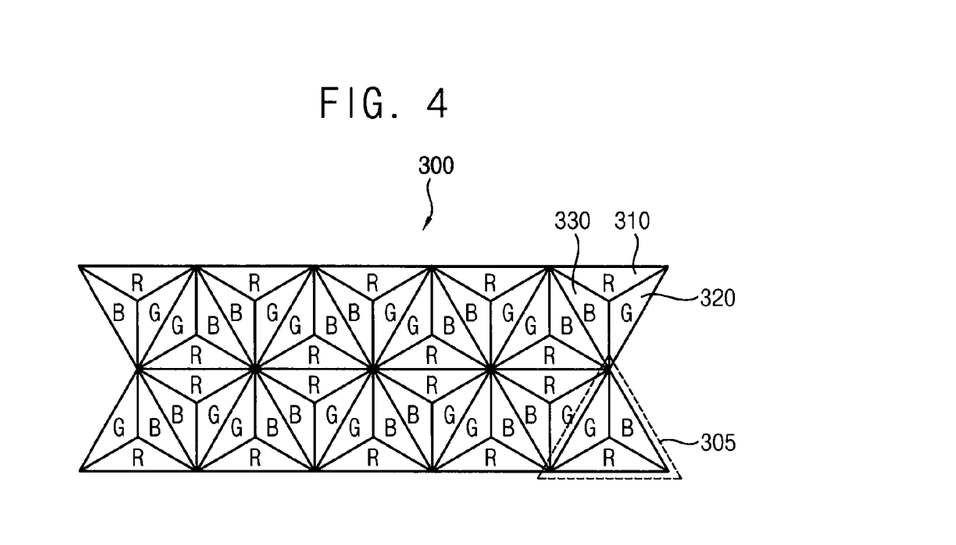
FIG. 4 is a plan view illustrating an alternative exemplary embodiment of a display panel.

FIG. 4 is a plan view illustrating an alternative exemplary embodiment of a display panel.

Referring to FIG. 4, the display panel 300 may include a plurality of unit pixels 305, each having a triangle-shape.

Each of the plurality of unit pixels 305 may include a first sub-pixel 310 that emits a first color light, a second sub-pixel 320 that emits a second color light, and a third sub-pixel 330 that emits a third color light. The first to third sub-pixels 310, 320 and 330 may include an isosceles triangle-shape. In such an embodiment, the first sub-pixels 310 of neighboring unit pixels 305 in a same row, the second sub-pixels 320 of neighboring unit pixels 305 in a same row, or the third sub-pixels 330 of neighboring unit pixels 305 in a same row may be arranged to adjoin each other in the display panel 300. In one exemplary embodiment, for example, each of the first sub-pixel 310, the second sub-pixel 320 and the third sub-pixel 330 may emit one of a red color light, a green color light, and a blue color light.

In an exemplary embodiment, where a first unit pixel, a second unit pixel, a third unit pixel, and a fourth unit pixel are located in a same row (i.e., an N-th row), a first sub-pixel 310 (e.g., a green color sub-pixel) of the first unit pixel and a first sub-pixel 310 (e.g., a green color sub-pixel) of the second unit pixel may be arranged adjacent to each other, a second sub-pixel 320 (e.g., a blue color sub-pixel) of the second unit pixel and a second sub-pixel 320 (e.g., a blue color sub-pixel) of the third unit pixel may be arranged adjacent to each other. In such an embodiment, the first sub-pixel 310 and the second sub-pixel 320 may have substantially a same area as each other. In such an embodiment, the first sub-pixel 310 of the first unit pixel and the first sub-pixel 310 of the second unit pixel may be simultaneously provided, e.g., formed at the same time, using a same opening portion of the mask (e.g., the fine metal mask), and the second sub-pixel 320 of the second unit pixel and the second sub-pixel 320 (e.g., a blue color sub-pixel) of the third unit pixel may be simultaneously provided, e.g., formed at the same time, using a same opening portion of the mask (e.g., the fine metal mask).

In a conventional display panel that includes a plurality of unit pixels, first sub-pixels of neighboring unit pixels located in the same row and/or the same column, second sub-pixels of neighboring unit pixels located in the same row and/or the same column, or third sub-pixels of neighboring unit pixels located in the same row and/or the same column are arranged apart from each other. Accordingly, such a structure of the conventional display panel may not allow the mask to secure a sufficient distance between opening portions of the mask. As a result, the conventional display panel has limits to implement a high resolution because a mechanical strength of respective masks for forming the first sub-pixels, the second sub-pixels, and the third sub-pixels of the unit pixels is reduced (i.e., weakened).

In an exemplary embodiment of the invention, a display panel 300 may include a plurality of unit pixels 305, each having a red color sub-pixel, a green color sub-pixel, and a blue color sub-pixel, where the red color sub-pixel, the green color sub-pixel, and the blue color sub-pixel may be formed using a mask for forming the red sub-pixel, a mask for forming the green sub-pixel, and a mask for forming the blue sub-pixel, respectively. In such an embodiment, the display panel 300 may allow the mask to secure a sufficient distance between opening portions of the mask by arranging the red color sub-pixels of neighboring unit pixels 305 located in the same row to adjoin each other, by arranging the green color sub-pixels of neighboring unit pixels 305 located in the same row to adjoin each other, or by arranging the blue color sub-pixels of neighboring unit pixels 305 located in the same row to adjoin each other. As a result, the display panel 300 may implement a high resolution without reducing a mechanical strength of at least one mask for forming the unit pixels 305 of the display panel 300 (e.g., the red color sub-pixels, the green color sub-pixels, and the blue color sub-pixels of the unit pixels 305).

Figure 5A:
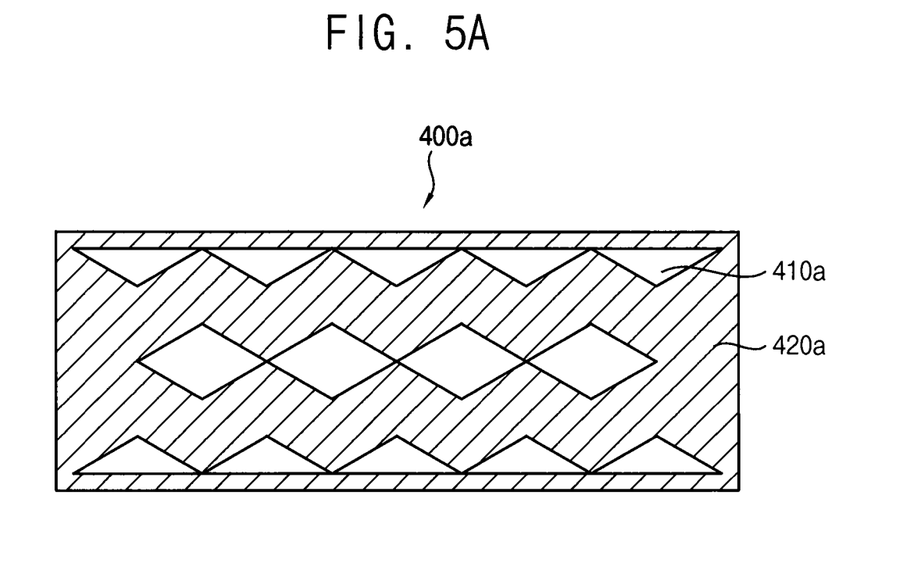
FIGS. 5A to 5C are plan views illustrating an exemplary embodiment of masks for forming a plurality of unit pixels of the display panel of FIG. 4.
Figure 5B:
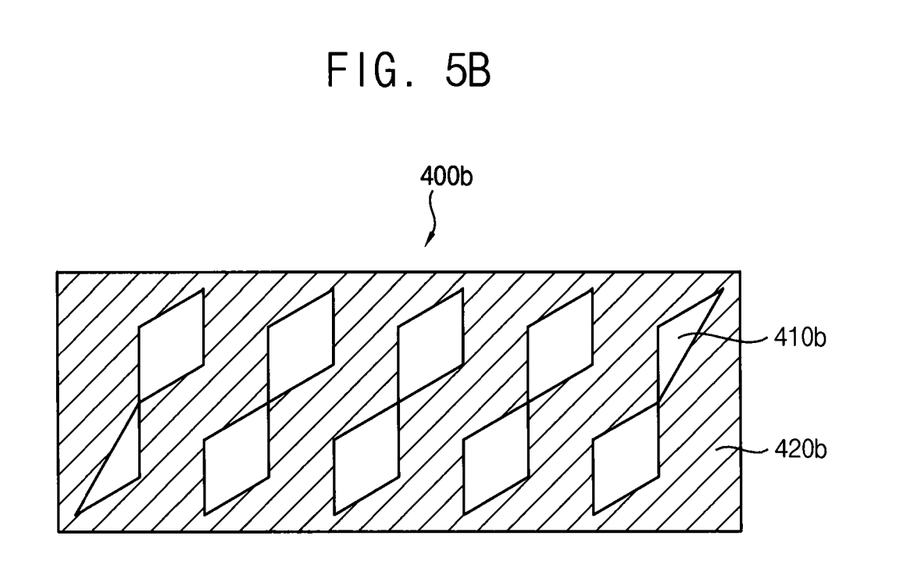
Figure 5C:
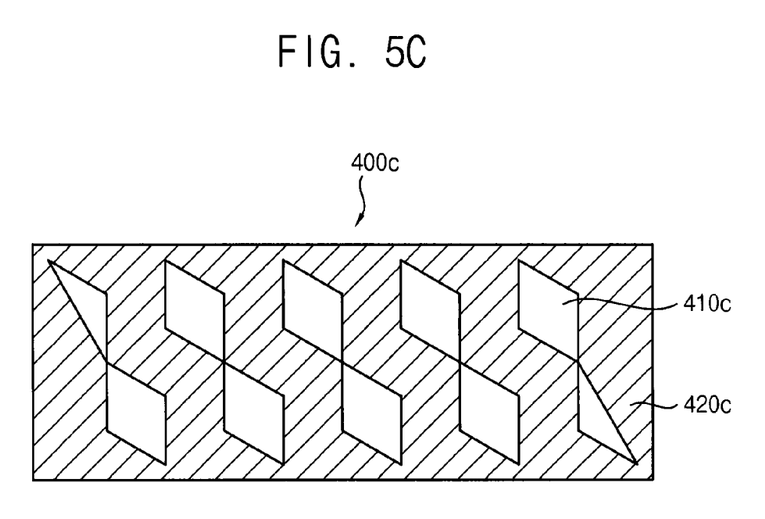

FIGS. 5A to 5C are plan views illustrating an exemplary embodiment of masks for forming a plurality of unit pixels of the display panel of FIG. 4.

Referring to FIG. 5A, a first mask 400a for forming first sub-pixels (e.g., red color sub-pixels) of the unit pixels may include a plurality of first opening portions 410a and a first blocking portion 420a. In exemplary embodiments, the first mask 400a may be a fine metal mask or a shadow mask. In such an embodiment, the first sub-pixels of neighboring unit pixels located in the same row may be arranged to adjoin each other in the display panel.

Referring to FIG. 5B, a second mask 400b for forming second sub-pixels (e.g., green color sub-pixels) of the unit pixels may include a plurality of second opening portions 410b and a second blocking portion 420b. In exemplary embodiments, the second mask 400b may be a fine metal mask or a shadow mask. In such an embodiment, the second sub-pixels of neighboring unit pixels located in the same row may be arranged to adjoin each other in the display panel.

Referring to FIG. 5C, a third mask 400c for forming third sub-pixels (e.g., blue color sub-pixels) of the unit pixels may include a plurality of third opening portions 410c and a third blocking portion 420c. In exemplary embodiments, the third mask 400c may be a fine metal mask or a shadow mask. In such an embodiment, the third sub-pixels of neighboring unit pixels located in the same row may be arranged to adjoin each other in the display panel.

The unit pixels of the display panel may be provided, e.g., formed, using a plurality of masks (e.g., the first mask 400a for forming the first sub-pixels, the second mask 400b for forming the second sub-pixels, and the third mask 400c for forming the third sub-pixels) However, the invention is not limited thereto. In one alternative exemplary embodiment, for example, the unit pixels of the display panel may be formed using a single mask for forming the first sub-pixels, the second sub-pixels, and the third sub-pixels by moving the single mask using a specific apparatus for moving the mask.

Figure 6A:
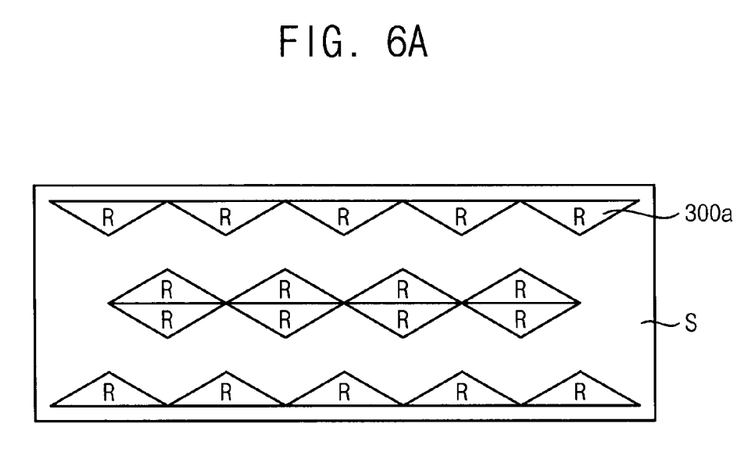
FIGS. 6A to 6C are plan views illustrating an exemplary embodiment of a method of manufacturing a plurality of unit pixels of the display panel of FIG. 4.
Figure 6B:
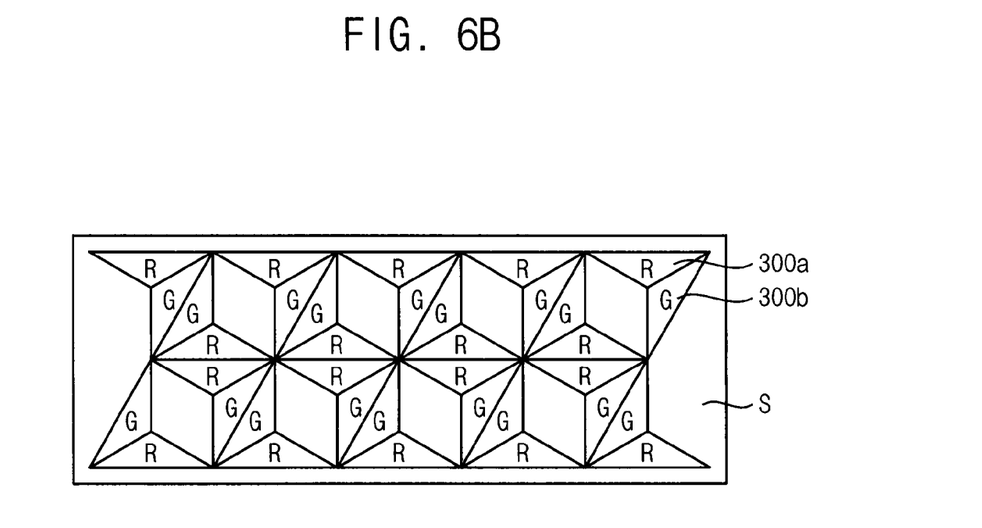
Figure 6C:
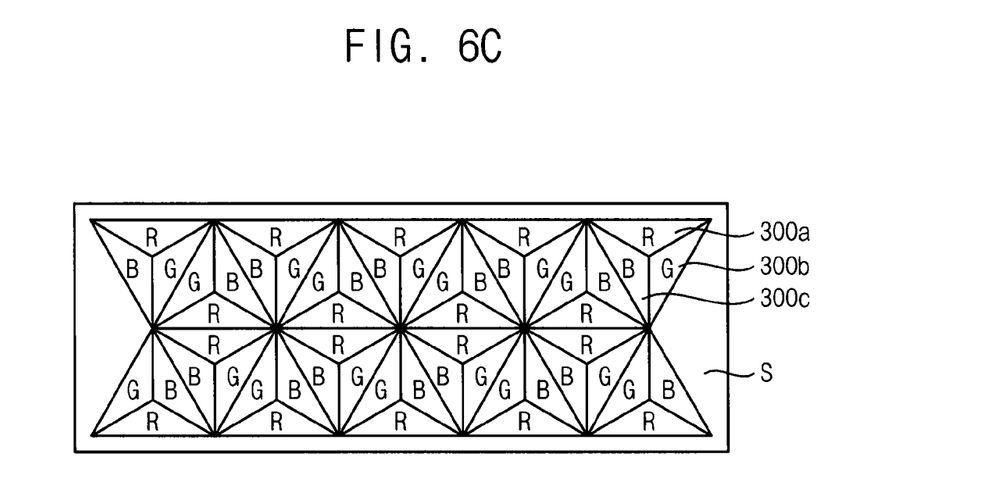

FIG. 6A to 6C are plan views illustrating an exemplary embodiment of a method of manufacturing a plurality of unit pixels of the display panel of FIG. 4.

Referring to FIGS. 6A to FIG. 6C, a first mask (see FIG. 5A) for forming first sub-pixels 300a (e.g., red color sub-pixels) of the unit pixels, a second mask (see FIG. 5B) for forming second sub-pixels 300b (e.g., green color sub-pixels) of the unit pixels, a third mask (see FIG. 5C) for forming third sub-pixels 300c (e.g., blue color sub-pixels) of the unit pixels may be positioned on a substrate S, and then the first sub-pixels 300a, the second sub-pixels 300b and the third sub-pixels 300c may be sequentially formed on the substrate S using the first mask for forming the first sub-pixels 300a, the second mask for forming the second sub-pixels 300b and the third mask for forming the third sub-pixels 300c, respectively.

As illustrated in FIG. 6A, the first sub-pixels 300a may be simultaneously formed on the substrate S using the first mask for forming the first sub-pixels 300a. In exemplary embodiments, the first sub-pixels 300a may emit a first color light. In one exemplary embodiment, for example, the first color light may correspond to a red color light As illustrated in FIG. 6B, the second sub-pixels 300b may be simultaneously formed on the substrate S using the second mask for forming the second sub-pixels 300b. In exemplary embodiments, the second sub-pixels 300b may emit a second color light. In one exemplary embodiment, for example, the second color light may correspond to a green color light.

As illustrated in FIG. 6C, the third sub-pixels 300c may be simultaneously formed on the substrate S using the third mask for forming the third sub-pixels 300c. In exemplary embodiments, the third sub-pixels 300c may emit a third color light. In one exemplary embodiment, for example, the third color light may correspond to a blue color light.

Exemplary embodiments as described herein may be applied to a display device and an electronic device having the display panel. For example, the embodiments may be applied to a television, a digital television, a mobile phone, a smart phone, a laptop computer, a tablet computer, a personal digital assistants ("PDA"), a portable multimedia player ("PMP"), a digital camera, a music player, a portable game console, a navigation device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:
1. A display panel comprising:
a plurality of unit pixels, wherein each of the unit pixels has a triangle-shape and comprises:
 a first sub-pixel configured to emit a first color light, wherein the first sub-pixel has an isosceles triangle-shape;
 a second sub-pixel configured to emit a second color light, wherein the second sub-pixel has the isosceles triangle-shape; and
 a third sub-pixel configured to emit a third color light, wherein the third sub-pixel has the isosceles triangle-shape,
wherein at least one of a plurality of first sub-pixels, a plurality of second sub-pixels and a plurality of third sub-pixels of neighboring unit pixels in a same row are arranged to adjoin each other.

2. The display panel of claim 1, wherein the first color light, the second color light, and the third color light are a red color light, a green color light and a blue color light.

3. The display panel of claim 1, wherein an area of the first sub-pixel, an area of the second sub-pixel, and an area of the third sub-pixel are substantially equal to each other.

4. The display panel of claim 1, wherein the display panel is an organic light emitting display panel.

5. The display panel of claim 1, wherein the display panel is a liquid crystal display panel.

6. The display panel of claim 1, wherein
the first sub-pixel defines a single isosceles triangle-shape;
the second sub-pixel defines the single isosceles triangle-shape; and
the third sub-pixel defines the single isosceles triangle-shape.

* * * * *